US008642481B2

(12) United States Patent
Wang et al.

(10) Patent No.: US 8,642,481 B2
(45) Date of Patent: Feb. 4, 2014

(54) DRY-ETCH FOR SILICON-AND-NITROGEN-CONTAINING FILMS

(71) Applicant: Applied Materials, Inc., Santa Clara, CA (US)

(72) Inventors: Yunyu Wang, San Jose, CA (US); Anchuan Wang, San Jose, CA (US); Jingchun Zhang, Milpitas, CA (US); Nitin K. Ingle, San Jose, CA (US); Young S. Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/745,251

(22) Filed: Jan. 18, 2013

(65) Prior Publication Data

US 2013/0130507 A1    May 23, 2013

Related U.S. Application Data

(63) Continuation of application No. 13/448,541, filed on Apr. 17, 2012.

(60) Provisional application No. 61/525,067, filed on Aug. 18, 2011.

(51) Int. Cl.
*H01L 21/302*    (2006.01)

(52) U.S. Cl.
USPC ........... 438/724; 438/710; 438/714; 438/730; 216/71; 156/345.34

(58) Field of Classification Search
USPC ......... 438/706, 710, 714, 715, 717, 719, 724, 438/735, 738, 727, 730, 731; 216/72, 79, 216/81; 156/345.3, 345.34
See application file for complete search history.

(56) References Cited

U.S. PATENT DOCUMENTS 5,926,737 A * 7/1999 Ameen et al. ................. 438/649
6,110,838 A * 8/2000 Loewenstein ................. 438/740
(Continued)

FOREIGN PATENT DOCUMENTS

WO    2013-025336    2/2013

OTHER PUBLICATIONS

U.S. Appl. No. 60/803,499, filed May 30, 2006.
(Continued)

*Primary Examiner* — Lan Vinh
(74) *Attorney, Agent, or Firm* — Kilpatrick Townsend & Stockton LLP

(57) ABSTRACT

A method of etching exposed silicon-and-nitrogen-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-nitrogen-containing material. The plasmas effluents react with the patterned heterogeneous structures to selectively remove silicon-and-nitrogen-containing material from the exposed silicon-and-nitrogen-containing material regions while very slowly removing other exposed materials. The silicon-and-nitrogen-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-nitrogen-containing material at more than twenty times the rate of silicon oxide.

19 Claims, 4 Drawing Sheets

(56) References Cited

U.S. PATENT DOCUMENTS

| | | |
|---|---|---|
| 6,387,207 B1 | 5/2002 | Janakiraman et al. |
| 6,830,624 B2 | 12/2004 | Janakiraman et al. |
| 2005/0112901 A1 * | 5/2005 | Ji et al. .................... 438/710 |

OTHER PUBLICATIONS

U.S. Appl. No. 61/525,067, filed Aug. 18, 2011.
U.S. Appl. No. 13/448,541, filed Apr. 17, 2012.

* cited by examiner

DRY-ETCH FOR SILICON-AND-NITROGEN-CONTAINING FILMS

CROSS-REFERENCES TO RELATED APPLICATIONS

This application is a continuation of U.S. patent application Ser. No. 13/448,541 filed Apr. 17, 2012 titled "DRY-ETCH FOR SILICON-AND-NITROGEN-CONTAINING FILMS," which application claims the benefit of U.S. Prov. Pat. App. No. 61/525,067 filed Aug. 18, 2011, and titled "DRY-ETCH FOR SILICON-AND-NITROGEN-CONTAINING FILMS," which is incorporated herein by reference for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials. However, there are few options for selectively etching silicon nitride faster than silicon.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have also been developed to remove silicon nitride, however, the silicon nitride selectivity of these etch processes (relative to silicon) has been limited.

Methods are needed to improve silicon nitride selectively relatively to silicon for dry etch processes.

BRIEF SUMMARY OF THE INVENTION

A method of etching exposed silicon-and-nitrogen-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-nitrogen-containing material. The plasmas effluents react with the patterned heterogeneous structures to selectively remove silicon-and-nitrogen-containing material from the exposed silicon-and-nitrogen-containing material regions while very slowly removing other exposed materials. The silicon-and-nitrogen-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-nitrogen-containing material at more than ten times the removal rate of silicon.

Embodiments of the invention include methods of etching a patterned substrate in a substrate processing region of a substrate processing chamber. The patterned substrate has an exposed silicon-and-nitrogen-containing region. The methods include flowing each of a fluorine-containing precursor and an oxygen-containing precursor into a remote plasma region fluidly coupled to the substrate processing region while forming a plasma in the plasma region to produce plasma effluents. The methods further include etching the exposed silicon-and-nitrogen-containing region by flowing the plasma effluents into the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

Figure 1:
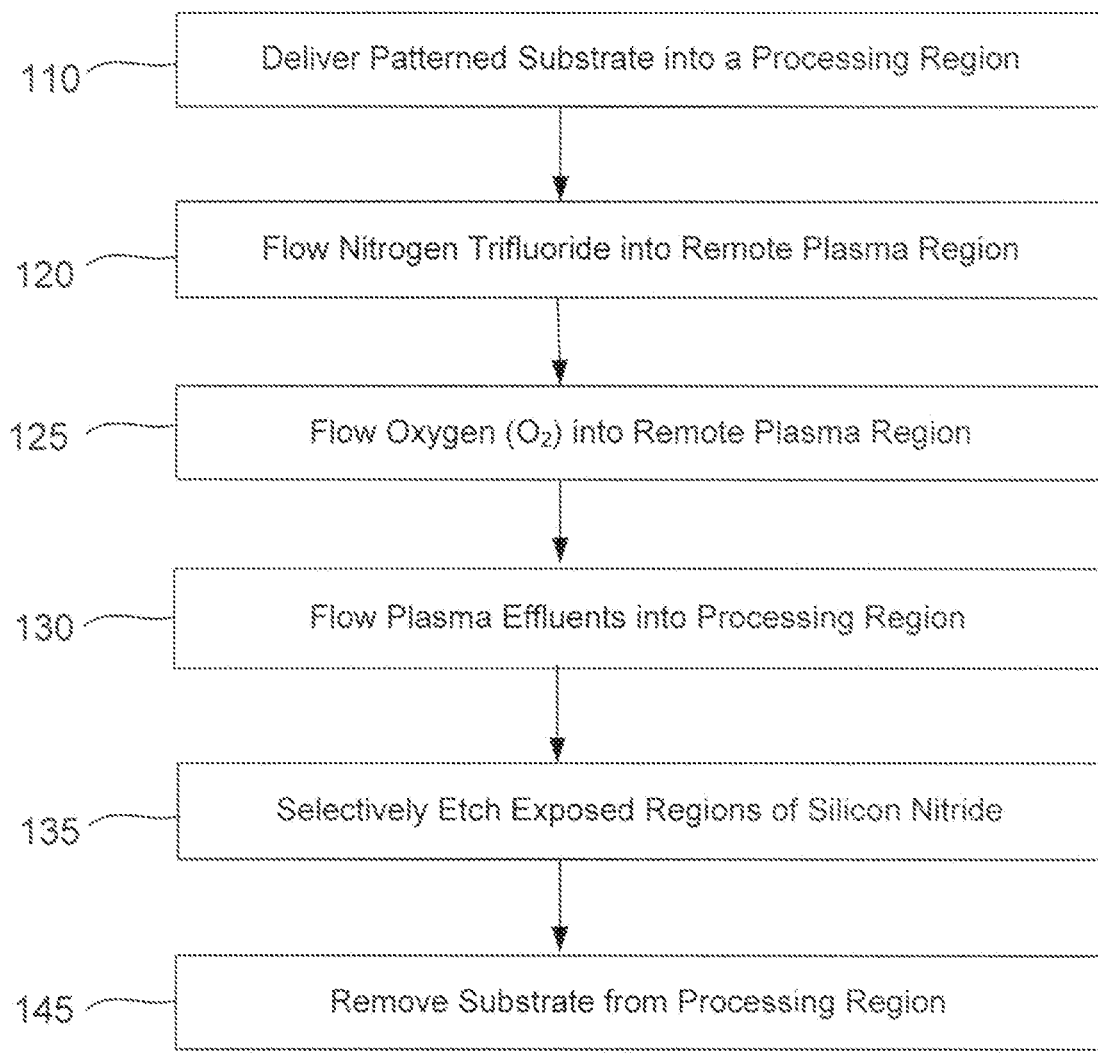
FIG. 1 is a flow chart of a silicon nitride selective etch process according to disclosed embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching exposed silicon-and-nitrogen-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-nitrogen-containing material. The plasmas effluents react with the patterned heterogeneous structures to selectively remove silicon-and-nitrogen-containing material from the exposed silicon-and-nitrogen-containing material regions while very slowly removing other exposed materials. The silicon-and-nitrogen-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-nitrogen-containing material at more than ten times the removal rate of silicon.

The ion suppression element functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process.

In accordance with some embodiments of the invention, an ion suppressor as described in the exemplary equipment section may be used to provide radical and/or neutral species for selectively etching substrates. In one embodiment, for example, an ion suppressor is used to provide fluorine and oxygen containing plasma effluents to selectively etch silicon-and-nitrogen-containing material. Using the plasma effluents, an etch rate selectivity of silicon-and-nitrogen-containing material to silicon over thirty may be achieved. The ion suppressor may be used to provide a reactive gas having a higher concentration of radicals than ions. Because most of the charged particles of a plasma are filtered or removed by the ion suppressor, the substrate is not necessarily biased during the etch process. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

In order to better understand and appreciate the invention, reference is now made to FIG. 1 which is a flow chart of a silicon nitride selective etch process according to disclosed embodiments. Silicon nitride is an example of a silicon-and-nitrogen-containing material. Prior to the first operation, a structure is formed in a patterned substrate. The structure possesses separate exposed regions of silicon nitride and silicon. The substrate is then delivered into a processing region (operation 110).

A flow of nitrogen trifluoride is introduced into a plasma region separate from the processing region (operation 120). Other sources of fluorine may be used to augment or replace the nitrogen trifluoride. In general, a fluorine-containing precursor may be flowed into the plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, sulfur hexafluoride and xenon difluoride. Even carbon containing precursors, such as carbon tetrafluoride, trifluoromethane, difluoromethane, fluoromethane and the like, can be added to the group already listed. The use of carbon-containing precursor generally requires an increased flow of the oxygen-containing precursors described herein to react with the carbon before it can be incorporated into the substrate. The separate plasma region may be referred to as a remote plasma region herein and may be within a distinct module from the processing chamber or a compartment within the processing chamber. Oxygen ($O_2$) is also flowed into the plasma region (operation 125) where it is simultaneously excited in a plasma along with the nitrogen trifluoride. Generally speaking, an oxygen-containing precursor may be flowed into the plasma region and the oxygen-containing precursor may comprise at least one precursor selected from $O_2$, $O_3$, $N_2O$, NO, $NO_2$, or the like. Some oxygen-containing precursors may be more reactive than others. Ozone may result in some oxidation of the silicon-and-nitrogen-containing material which could reduce the selectivities described below.

The plasma effluents formed in the remote plasma region are then flowed into the substrate processing region (operation 130). The patterned substrate is selectively etched (operation 135) such that the exposed silicon nitride is removed at a rate at least ten times greater than the exposed silicon. The invention involves maintenance of a high atomic flow ratio of oxygen (O) to fluorine (F) in order achieve high etch selectivity of silicon-and-nitrogen-containing films (in this case silicon nitride). The presence of oxygen helps to oxidize any exposed silicon rendering silicon domains essentially unetchable by the fluorine-containing plasma effluents in embodiments. In one embodiment, a gas flow ratio ($O_2$:$NF_3$) greater than or about 10:1, or in general terms, greater than or about an atomic flow ratio of between 20:3, was found to achieve etch selectivity (silicon nitride:silicon) of greater than or about 10:1. In other embodiments, the atomic flow ratio (O:F) may be greater than or about 10:1, for example, by supplying a gas flow ratio ($O_2$:$NF_3$) of greater than or about 15:1. The etch selectivity (silicon nitride:silicon) may also be greater than or about 15:1, greater than or about 15:1, greater than or about 20:1 or greater than or about 25:1 in disclosed embodiments. Regions of exposed silicon oxide may also be present on the patterned substrate. The etch selectivity may be greater than or about 30:1, greater than or about 50:1 or greater than or about 80:1 in disclosed embodiments. Higher ranges may be used for fluorine-containing precursors which contain carbon. Additional oxygen helps to remove the carbon before it can be incorporated in the substrate, where it may adversely impact device performance. The more general atomic flow ratio, O:F, is calculated from the gas flow rate of each precursor gas and the total number of each atom per molecule. In the embodiment wherein one precursor is $O_2$ and another is $NF_3$, each molecule of oxygen includes two oxygen atoms whereas each molecule of nitrogen trifluoride includes three fluorine atoms. Using mass flow controllers to maintain a gas flow ratio above, e.g. 10:1, will result in an atomic flow ratio of above 20:3. In another embodiment, the precursor gases include at least one gas which contains both oxygen and fluorine. The atomic flow rate of all contributions are included when calculating the atomic flow ratio.

The reactive chemical species are removed from the substrate processing region and then the substrate is removed from the processing region (operation 145). The flow of oxygen ($O_2$) into the plasma and resulting flow of oxygen-containing excited species into the substrate processing region enables the fluorine-containing excited species in the plasma effluents to remove the silicon nitride while limiting the removal rate of the exposed silicon. The flow of oxygen-containing excited species into the substrate processing region has little effect on the exposed regions of silicon oxide and the fluorine-containing excited species are substantially unable to etch the silicon oxide regions.

Using the oxygen-containing precursor, as described herein, does not significantly affect the etch rate of the silicon nitride but does decrease the etch rate of silicon, leading to the relatively high selectivity. The fluorine-containing precursor and/or the oxygen-containing precursor may further include one or more relatively inert gases such as He, $N_2$, Ar, or the like. The inert gas can be used to improve plasma stability. Flow rates and ratios of the different gases may be used to control etch rates and etch selectivity. In an embodiment, the fluorine-containing gas includes $NF_3$ at a flow rate of between about 5 sccm (standard cubic centimeters per minute) and 300 sccm, $O_2$ at a flow rate of between about 50 sccm and 2 slm (standard liters per minute), He at a flow rate of between about 0 sccm and 3000 sccm, and Ar at a flow rate of between about 0 sccm and 3000 sccm. One of ordinary skill in the art would recognize that other gases and/or flows may be used depending on a number of factors including processing chamber configuration, substrate size, geometry and layout of features being etched, and the like. Some hydrogen-containing precursors may also be combined with the other precursors or flowed separately into the plasma region, however, the concentration should be kept low. Hydrogen may interact with the fluorine-containing precursor in the plasma to form precursors which remove silicon oxide by forming solid residue by-products on the oxide surface. This reaction reduces the selectivity of the exposed silicon nitride regions as compared with exposed silicon oxide regions. Though some hydrogen may be useful to introduce in some embodiments, there may also be no or essentially no flow of hydrogen into the plasma region during the etch process in other embodiments.

The method also includes applying energy to the fluorine-containing precursor and the oxygen-containing precursor while they are in the remote plasma region to generate the plasma effluents. As would be appreciated by one of ordinary skill in the art, the plasma may include a number of charged and neutral species including radicals and ions. The plasma may be generated using known techniques (e.g., RF, capacitively coupled, inductively coupled, and the like). In an embodiment, the energy is applied using a capacitively-coupled plasma unit at a source power of between about 10 W and 2000 W and a pressure of between about 0.2 Torr and 30 Torr. The capacitively-coupled plasma unit may be disposed remote from a gas reaction region of the processing chamber. For example, the capacitively-coupled plasma unit and the plasma generation region may be separated from the gas reaction region by an ion suppressor.

Without wishing to bind the coverage of the claims to theoretical mechanisms which may or may not be entirely correct, some discussion of possible mechanisms may prove beneficial. Without the assistance of radical-oxygen, radical-fluorine is selective towards silicon and silicon-and-nitrogen-containing material, while leaving silicon oxide essentially unetched. In this invention, radical-fluorine and radical-oxygen are concurrently produced by delivering a fluorine-containing precursor and an oxygen-containing precursor into the remote plasma region. Applicants suppose that a concentration of radical-fluorine fragments, fluorine ions and atoms are produced and delivered into the substrate processing region. Applicants further suppose that radical-oxygen species are concurrently delivered to the substrate processing region. The preponderance of radical-oxygen species may react with exposed silicon regions in the near surface region to create a thin silicon oxide layer so exposed region of silicon behave similarly to exposed regions of silicon oxide. The thin silicon oxide layer protects the silicon region from radical fluorine species. As a consequence, the etching methods outlined herein achieve selectivity toward silicon-and-nitrogen-containing material.

Blanket wafers of silicon oxide, silicon and silicon nitride were used to quantify the etch rates for an exemplary process. A remote plasma was formed from nitrogen trifluoride, oxygen ($O_2$), helium and argon and the effluents etched blanket wafers of each of the three films in separate processes. The etch process removed silicon nitride at about one hundred times the rate of silicon oxide and over thirty times the rate of silicon in the form of polysilicon. The selectivity, the non-local plasma, the controlled ionic concentration and the lack of solid byproducts, each make these etch processes well suited for removing or trimming delicate silicon-and-nitrogen-containing material structures with little deformation and while removing little or no silicon oxide. These selectivities also apply generally to silicon-and-nitrogen-containing material and to silicon nitride in particular.

The temperature of the substrate may be between about −30° C. and about 150° C. in general. The etch rate has been found to be higher for the lower temperatures within this range. In embodiments, the temperature of the substrate during the etches described herein is about −20° C., 0° C. or more, about 5° C. or more or about 10° C. or more. The substrate temperatures may be less than or about 150° C., less than or about 100° C., less than or about 50° C., less than or about 30° C., less than or about 20° C., less than or about 15° C. or less than or about 10° C. in different embodiments. The data further show an increase in etch rate as a function of process pressure. The pressure within the substrate processing region is below or about 50 Torr, below or about 30 Torr, below or about 20 Torr, below or about 10 Torr or below or about 5 Torr. The pressure may be above or about 0.1 Torr, above or about 0.2 Torr, above or about 0.5 Torr or above or about 1 Torr in embodiments of the invention. Any of the upper limits on temperature or pressure may be combined with lower limits to form additional embodiments. Generally speaking, the processes described herein may be used to describe films which contain silicon and nitrogen (and not just silicon nitride). The remote plasma etch processes may remove silicon-and-nitrogen-containing material which includes an atomic concentration of about 30% or more silicon and about 30% or more nitrogen in embodiments of the invention. The silicon-and-nitrogen-containing material may also consist essentially of silicon and nitrogen, allowing for small dopant concentrations and other undesirable or desirable minority additives. Of course, the silicon-and-nitrogen-containing material may consist essentially of silicon nitride in embodiments of the invention.

Additional process parameters are disclosed in the course of describing an exemplary processing chamber and system.

Exemplary Processing System

Processing chambers that may implement embodiments of the present invention may be included within processing platforms such as the CENTURA® and PRODUCER® systems, available from Applied Materials, Inc. of Santa Clara, Calif. Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 2A:
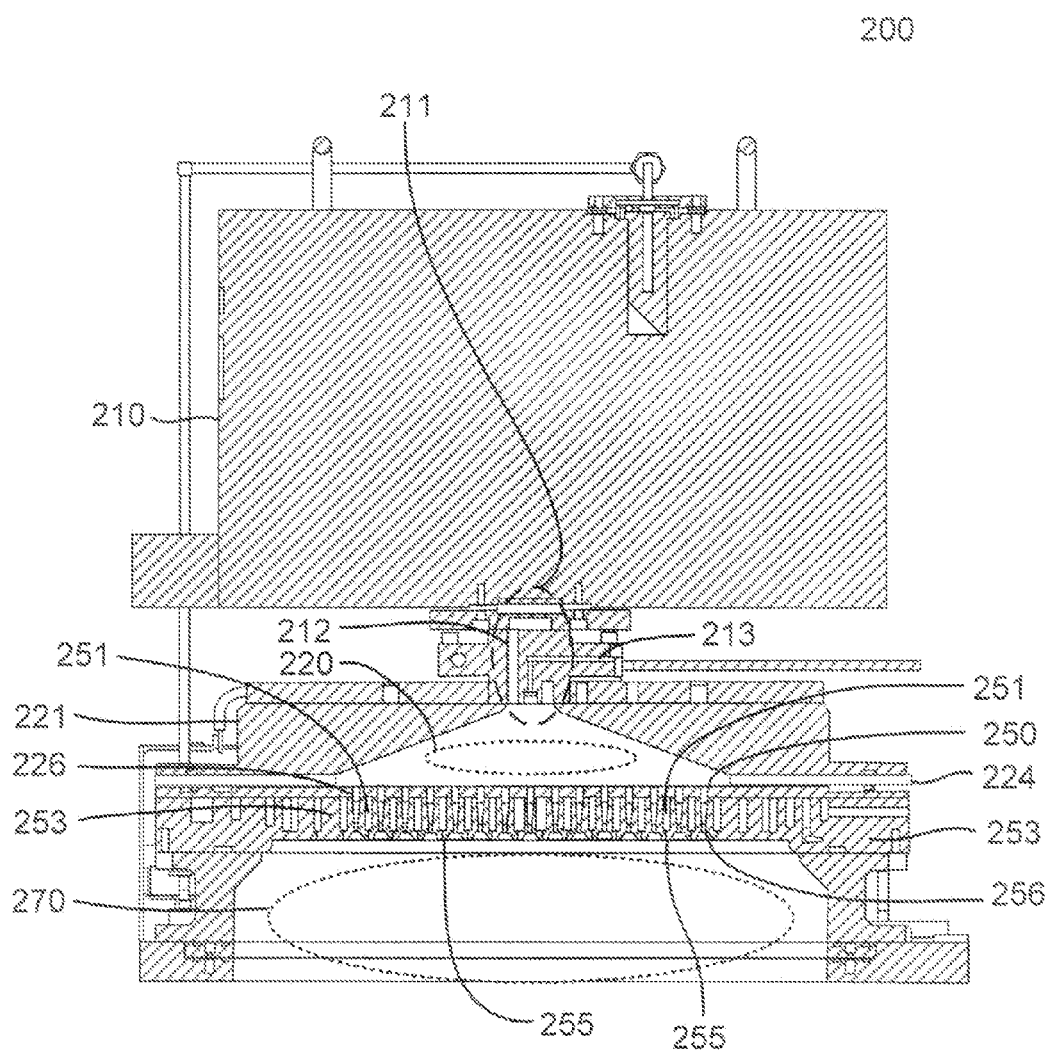
FIG. 2A shows a substrate processing chamber according to embodiments of the invention.

FIG. 2A is a substrate processing chamber 200 according to disclosed embodiments. A remote plasma system 210 may process the fluorine-containing precursor which then travels through a gas inlet assembly 211. Two distinct gas supply channels are visible within the gas inlet assembly 211. A first channel 212 carries a gas that passes through the remote plasma system 210 (RPS), while a second channel 213 bypasses the remote plasma system 210. Either channel may be used for the fluorine-containing precursor, in embodiments. On the other hand, the first channel 212 may be used for the process gas and the second channel 213 may be used for a treatment gas. The lid (or conductive top portion) 221 and a perforated partition 253 are shown with an insulating ring 224 in between, which allows an AC potential to be applied to the lid 221 relative to perforated partition 253. The AC potential strikes a plasma in chamber plasma region 220. The process gas may travel through first channel 212 into chamber plasma region 220 and may be excited by a plasma in chamber plasma region 220 alone or in combination with remote plasma system 210. If the process gas (the fluorine-containing precursor) flows through second channel 213, then only the chamber plasma region 220 is used for excitation. The combination of chamber plasma region 220 and/or remote plasma system 210 may be referred to as a remote plasma system herein. The perforated partition (also referred to as a showerhead) 253 separates chamber plasma region 220 from a substrate processing region 270 beneath showerhead 253. Showerhead 253 allows a plasma present in chamber plasma region 220 to avoid directly exciting gases in substrate processing region 270, while still allowing excited species to travel from chamber plasma region 220 into substrate processing region 270.

Showerhead 253 is positioned between chamber plasma region 220 and substrate processing region 270 and allows plasma effluents (excited derivatives of precursors or other gases) created within remote plasma system 210 and/or chamber plasma region 220 to pass through a plurality of through-holes 256 that traverse the thickness of the plate. The showerhead 253 also has one or more hollow volumes 251 which can be filled with a precursor in the form of a vapor or gas (such as a silicon-containing precursor) and pass through small holes 255 into substrate processing region 270 but not directly into chamber plasma region 220. Showerhead 253 is thicker than the length of the smallest diameter 250 of the through-holes 256 in this disclosed embodiment. In order to maintain a significant concentration of excited species penetrating from chamber plasma region 220 to substrate processing region 270, the length 226 of the smallest diameter 250 of the through-holes may be restricted by forming larger diameter portions of through-holes 256 part way through the showerhead 253. The length of the smallest diameter 250 of the through-holes 256 may be the same order of magnitude as the smallest diameter of the through-holes 256 or less in disclosed embodiments.

Showerhead 253 may be configured to serve the purpose of an ion suppressor as shown in FIG. 2A. Alternatively, a separate processing chamber element may be included (not shown) which suppresses the ion concentration traveling into substrate processing region 270. Lid 221 and showerhead 253 may function as a first electrode and second electrode, respectively, so that lid 221 and showerhead 253 may receive different electric voltages. In these configurations, electrical power (e.g., RF power) may be applied to lid 221, showerhead 253, or both. For example, electrical power may be applied to lid 221 while showerhead 253 (serving as ion suppressor) is grounded. The substrate processing system may include a RF generator that provides electrical power to the lid and/or showerhead 253. The voltage applied to lid 221 may facilitate a uniform distribution of plasma (i.e., reduce localized plasma) within chamber plasma region 220. To enable the formation of a plasma in chamber plasma region 220, insulating ring 224 may electrically insulate lid 221 from showerhead 253. Insulating ring 224 may be made from a ceramic and may have a high breakdown voltage to avoid sparking. Portions of substrate processing chamber 200 near the capacitively-coupled plasma components just described may further include a cooling unit (not shown) that includes one or more cooling fluid channels to cool surfaces exposed to the plasma with a circulating coolant (e.g., water).

In the embodiment shown, showerhead 253 may distribute (via through-holes 256) process gases which contain oxygen, fluorine and/or nitrogen and/or plasma effluents of such process gases upon excitation by a plasma in chamber plasma region 220. In embodiments, the process gas introduced into the remote plasma system 210 and/or chamber plasma region 220 may contain fluorine (e.g. $F_2$, $NF_3$ or $XeF_2$). The process gas may also include a carrier gas such as helium, argon, nitrogen ($N_2$), etc. Plasma effluents may include ionized or neutral derivatives of the process gas and may also be referred to herein as radical-fluorine referring to the atomic constituent of the process gas introduced.

Through-holes 256 are configured to suppress the migration of ionically-charged species out of the chamber plasma region 220 while allowing uncharged neutral or radical species to pass through showerhead 253 into substrate processing region 270. These uncharged species may include highly reactive species that are transported with less-reactive carrier gas by through-holes 256. As noted above, the migration of ionic species by through-holes 256 may be reduced, and in some instances completely suppressed. Controlling the amount of ionic species passing through showerhead 253 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., silicon nitride:silicon etch ratios).

In embodiments, the number of through-holes 256 may be between about 60 and about 2000. Through-holes 256 may have a variety of shapes but are most easily made round. The smallest diameter 250 of through-holes 256 may be between about 0.5 mm and about 20 mm or between about 1 mm and about 6 mm in disclosed embodiments. There is also latitude in choosing the cross-sectional shape of through-holes, which may be made conical, cylindrical or combinations of the two shapes. The number of small holes 255 used to introduce unexcited precursors into substrate processing region 270 may be between about 100 and about 5000 or between about 500 and about 2000 in different embodiments. The diameter of the small holes 255 may be between about 0.1 mm and about 2 mm.

Through-holes 256 may be configured to control the passage of the plasma-activated gas (i.e., the ionic, radical, and/or neutral species) through showerhead 253. For example, the aspect ratio of the holes (i.e., the hole diameter to length) and/or the geometry of the holes may be controlled so that the flow of ionically-charged species in the activated gas passing through showerhead 253 is reduced. Through-holes 256 in showerhead 253 may include a tapered portion that faces chamber plasma region 220, and a cylindrical portion that faces substrate processing region 270. The cylindrical portion may be proportioned and dimensioned to control the flow of ionic species passing into substrate processing region 270. An adjustable electrical bias may also be applied to showerhead 253 as an additional means to control the flow of ionic species through showerhead 253.

Alternatively, through-holes 256 may have a smaller inner diameter (ID) toward the top surface of showerhead 253 and a larger ID toward the bottom surface. In addition, the bottom edge of through-holes 256 may be chamfered to help evenly distribute the plasma effluents in substrate processing region 270 as the plasma effluents exit the showerhead and thereby promote even distribution of the plasma effluents and precursor gases. The smaller ID may be placed at a variety of locations along through-holes 256 and still allow showerhead 253 to reduce the ion density within substrate processing region 270. The reduction in ion density results from an increase in the number of collisions with walls prior to entry into substrate processing region 270. Each collision increases the probability that an ion is neutralized by the acquisition or loss of an electron from the wall. Generally speaking, the smaller ID of through-holes 256 may be between about 0.2 mm and about 20 mm. In other embodiments, the smaller ID may be between about 1 mm and 6 mm or between about 0.2 mm and about 5 mm. Further, aspect ratios of the through-holes 256 (i.e., the smaller ID to hole length) may be approximately 1 to 20. The smaller ID of the through-holes may be the minimum ID found along the length of the through-holes. The cross sectional shape of through-holes 256 may be generally cylindrical, conical, or any combination thereof.

Figure 2B:
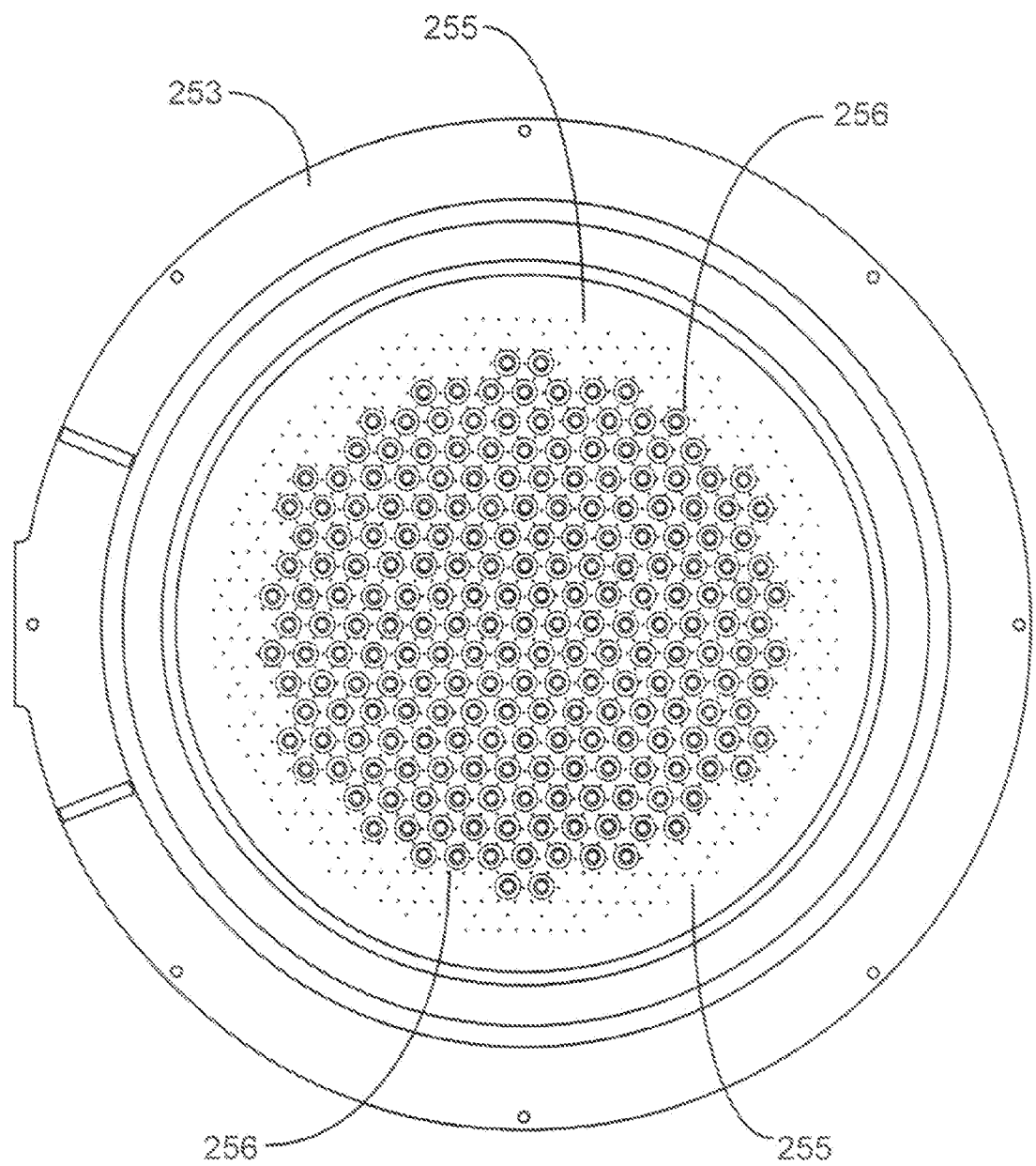
FIG. 2B shows a showerhead of a substrate processing chamber according to embodiments of the invention.

FIG. 2B is a bottom view of a showerhead 253 for use with a processing chamber according to disclosed embodiments. Showerhead 253 corresponds with the showerhead shown in FIG. 2A. Through-holes 256 are depicted with a larger inner-diameter (ID) on the bottom of showerhead 253 and a smaller ID at the top. Small holes 255 are distributed substantially evenly over the surface of the showerhead, even amongst the through-holes 256 which helps to provide more even mixing than other embodiments described herein.

An exemplary patterned substrate may be supported by a pedestal (not shown) within substrate processing region 270 when fluorine-containing plasma effluents and oxygen-containing plasma effluents arrive through through-holes 256 in showerhead 253. Though substrate processing region 270 may be equipped to support a plasma for other processes such as curing, no plasma is present during the etching of patterned substrate, in embodiments of the invention.

A plasma may be ignited either in chamber plasma region 220 above showerhead 253 or substrate processing region 270 below showerhead 253. A plasma is present in chamber plasma region 220 to produce the radical-fluorine from an inflow of the fluorine-containing precursor. An AC voltage typically in the radio frequency (RF) range is applied between the conductive top portion (lid 221) of the processing chamber and showerhead 253 to ignite a plasma in chamber plasma region 220 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 270 is turned on to either cure a film or clean the interior surfaces bordering substrate processing region 270. A plasma in substrate processing region 270 is ignited by applying an AC voltage between showerhead 253 and the pedestal or bottom of the chamber. A cleaning gas may be introduced into substrate processing region 270 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The chamber plasma region or a region in a remote plasma system may be referred to as a remote plasma region. In embodiments, the radical precursors (e.g. radical-fluorine and radical-oxygen) are formed in the remote plasma region and travel into the substrate processing region where the combination preferentially etches silicon-and-nitrogen-containing material. Plasma power may essentially be applied only to the remote plasma region, in embodiments, to ensure that the radical-fluorine and the radical-oxygen (which together may be referred to as plasma effluents) are not further excited in the substrate processing region.

In embodiments employing a chamber plasma region, the excited plasma effluents are generated in a section of the substrate processing region partitioned from a deposition region. The deposition region, also known herein as the substrate processing region, is where the plasma effluents mix and react to etch the patterned substrate (e.g., a semiconductor wafer). The excited plasma effluents may also be accompanied by inert gases (in the exemplary case, argon). The substrate processing region may be described herein as "plasma-free" during the etch of the patterned substrate. "Plasma-free" does not necessarily mean the region is devoid of plasma. A relatively low concentration of ionized species and free electrons created within the plasma region do travel through pores (apertures) in the partition (showerhead/ion suppressor) due to the shapes and sizes of through-holes 256. In some embodiments, there is essentially no concentration of ionized species and free electrons within the substrate processing region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

Nitrogen trifluoride (or another fluorine-containing precursor) may be flowed into chamber plasma region 220 at rates between about 5 sccm and about 500 sccm, between about 10 sccm and about 300 sccm, between about 25 sccm and about 200 sccm, between about 50 sccm and about 150 sccm or between about 75 sccm and about 125 sccm in different embodiments. Oxygen ($O_2$) may be flowed into chamber plasma region 220 at rates greater than or about 250 sccm, greater than or about 500 sccm, greater than or about 1 slm, greater than or about 2 slm or greater than or about 5 slm in different embodiments.

Combined flow rates of fluorine-containing precursor and oxygen-containing precursor into the chamber may account for 0.05% to about 20% by volume of the overall gas mixture; the remainder being carrier gases. The fluorine-containing precursor and the oxygen-containing precursor are flowed into the remote plasma region but the plasma effluents have the same volumetric flow ratio, in embodiments. In the case of the fluorine-containing precursor, a purge or carrier gas may be first initiated into the remote plasma region before those of the fluorine-containing gas to stabilize the pressure within the remote plasma region.

Plasma power applied to the remote plasma region can be a variety of frequencies or a combination of multiple frequencies. In the exemplary processing system the plasma is provided by RF power delivered between lid 221 and showerhead 253. The RF power may be between about 10 Watts and about 15000 Watts, between about 10 Watts and about 5000 Watts, between about 10 Watts and about 2000 Watts, between about 20 Watts and about 1500 Watts or between about 50 Watts and about 500 Watts in different embodiments. The RF frequency applied in the exemplary processing system may be low RF frequencies less than about 200 kHz, high RF frequencies between about 10 MHz and about 15 MHz or microwave frequencies greater than or about 1 GHz in different embodiments.

Substrate processing region 270 can be maintained at a variety of pressures during the flow of carrier gases and plasma effluents into substrate processing region 270. The pressure within the substrate processing region is below or about 50 Torr, below or about 30 Torr, below or about 20 Torr, below or about 10 Torr or below or about 5 Torr. The pressure may be above or about 0.1 Torr, above or about 0.2 Torr, above or about 0.5 Torr or above or about 1 Torr in embodiments of the invention. Lower limits on the pressure may be combined with upper limits on the pressure to arrive at further embodiments of the invention.

In one or more embodiments, the substrate processing chamber 200 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Processing chambers that may implement embodiments of the present invention may include dielectric etch chambers or a variety of chemical vapor deposition chambers, among other types of chambers.

Figure 3:
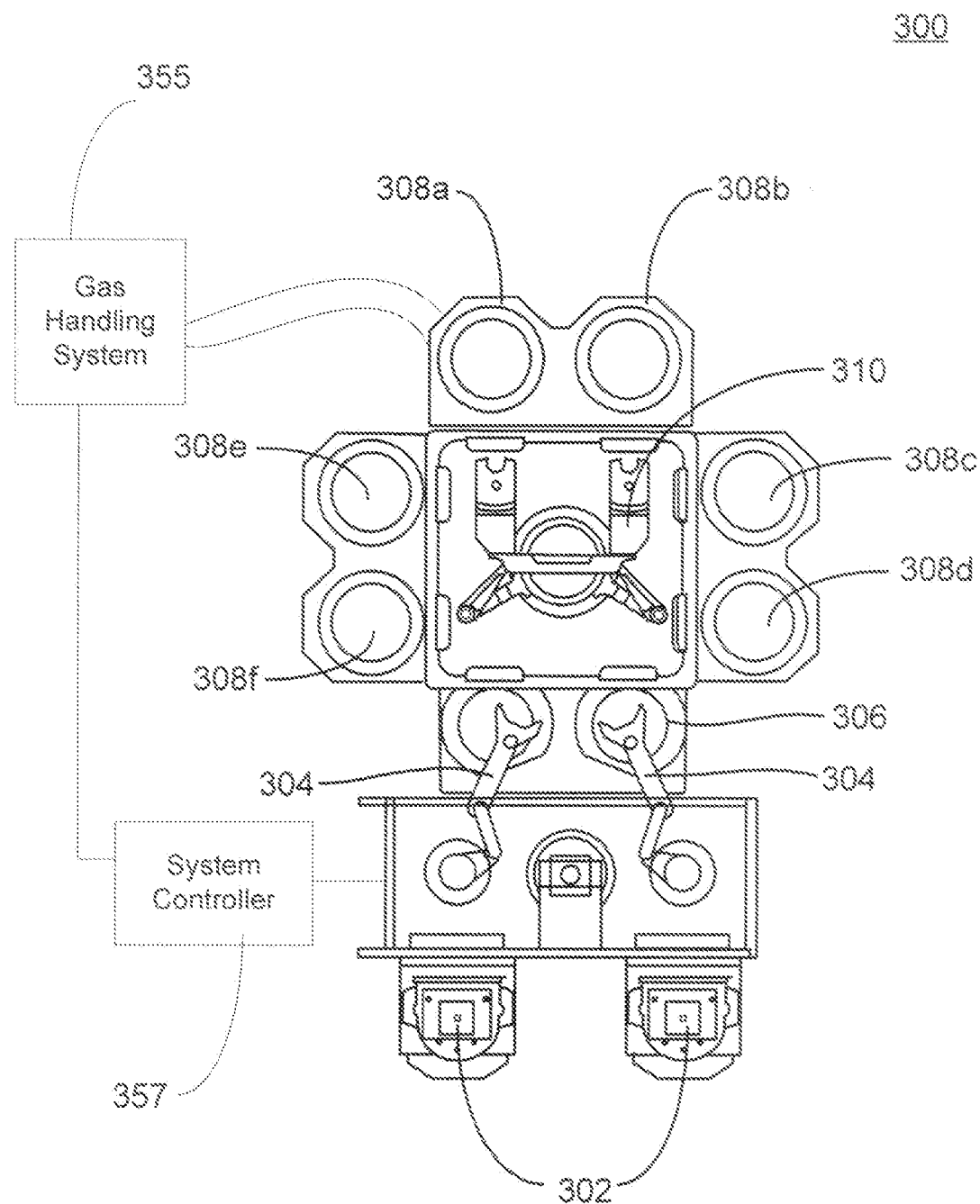
FIG. 3 shows a substrate processing system according to embodiments of the invention.

Embodiments of the deposition systems may be incorporated into larger fabrication systems for producing integrated circuit chips. FIG. 3 shows one such system 300 of deposition, baking and curing chambers according to disclosed embodiments. In the figure, a pair of FOUPs (front opening unified pods) 302 supply substrate substrates (e.g., 300 mm diameter wafers) that are received by robotic arms 304 and placed into a low pressure holding areas 306 before being placed into one of the wafer processing chambers 308a-f. A second robotic arm 310 may be used to transport the substrate wafers from the low pressure holding areas 306 to the wafer processing chambers 308a-f and back. Each wafer processing chamber 308a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The wafer processing chambers 308a-f may include one or more system components for depositing, annealing, curing and/or etching a flowable dielectric film on the substrate wafer. In one configuration, two pairs of the processing chamber (e.g., 308c-d and 308e-f) may be used to deposit dielectric material on the substrate, and the third pair of processing chambers (e.g., 308a-b) may be used to etch the deposited dielectric. In another configuration, all three pairs of chambers (e.g., 308a-f) may be configured to etch a dielectric film on the substrate. Any one or more of the processes described may be carried out on chamber(s) separated from the fabrication system shown in different embodiments.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

System controller 357 is used to control motors, valves, flow controllers, power supplies and other functions required to carry out process recipes described herein. A gas handling system 355 may also be controlled by system controller 357 to introduce gases to one or all of the wafer processing chambers 308a-f. System controller 357 may rely on feedback from optical sensors to determine and adjust the position of movable mechanical assemblies in gas handling system 355 and/or in wafer processing chambers 308a-f. Mechanical assemblies may include the robot, throttle valves and susceptors which are moved by motors under the control of system controller 357.

In an exemplary embodiment, system controller 357 includes a hard disk drive (memory), USB ports, a floppy disk drive and a processor. System controller 357 includes analog and digital input/output boards, interface boards and stepper motor controller boards. Various parts of multi-chamber processing system 300 which contains substrate processing chamber 200 are controlled by system controller 357. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly Si but may include minority concentrations of other elemental constituents such as nitrogen, oxygen, hydrogen, carbon and the like. Exposed "silicon nitride" of the patterned substrate is predominantly $Si_3N_4$ but may include minority concentrations of other elemental constituents such as oxygen, hydrogen, carbon and the like. Exposed "silicon oxide" of the patterned substrate is predominantly $SiO_2$ but may include minority concentrations of other elemental constituents such as nitrogen, hydrogen, carbon and the like. In some embodiments, silicon oxide films etched using the methods disclosed herein consist essentially of silicon and oxygen. The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" (or "radical-oxygen") are radical precursors which contain fluorine (or oxygen) but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a patterned substrate in a substrate processing region of a substrate processing chamber, wherein the patterned substrate has an exposed silicon-and-nitrogen-containing region, the method comprising:
    flowing each of a fluorine-containing precursor and an oxygen-containing precursor into a remote plasma region fluidly coupled to the substrate processing region while forming a plasma in the plasma region to produce plasma effluents, wherein an atomic flow ratio of oxygen to fluorine provided by the fluorine-containing and oxygen-containing precursors is greater than about 20:3; and
    etching the exposed silicon-and-nitrogen-containing region by flowing the plasma effluents into the substrate processing region through an ion suppressor configured to provide a higher concentration of radicals than ions, and wherein the oxygen oxidizes exposed silicon rendering silicon domains essentially unetchable by the fluorine-containing plasma effluents.

2. The method of claim 1 wherein the exposed silicon-and-nitrogen-containing region is silicon nitride.

3. The method of claim 1 wherein the exposed silicon-and-nitrogen-containing region consists essentially of silicon and nitrogen.

4. The method of claim 1 wherein the exposed silicon-and-nitrogen-containing region comprises about 30% or more silicon and about 30% or more nitrogen.

5. The method of claim 1 wherein a temperature of the patterned substrate is greater than or about 20° C. and less than or about 150° C.

6. The method of claim 1 wherein a pressure within the substrate processing region is below or about 50 Torr and above or about 0.1 Torr.

7. The method of claim 1 wherein forming a plasma in the plasma region to produce plasma effluents comprises applying RF power between about 10 Watts and about 15,000 Watts to the plasma region.

8. The method of claim 1 wherein the plasma is a capacitively-coupled plasma.

9. The method of claim 1 wherein the oxygen-containing precursor comprises molecular oxygen ($O_2$).

10. The method of claim 1 wherein the oxygen-containing precursor comprises at least one of $O_2$, $O_3$, NO, $N_2O$ or $NO_2$.

11. The method of claim 1 wherein the substrate processing region is plasma-free.

12. The method of claim 1 wherein the patterned substrate further comprises an exposed silicon oxide region and the selectivity of the etching operation (exposed silicon-and-nitrogen-containing region: exposed silicon oxide region) is greater than or about 30:1.

13. The method of claim 1 wherein the patterned substrate further comprises an exposed silicon region and the selectivity of the etching operation (exposed silicon-and-carbon-containing region: exposed silicon region) is greater than or about 10:1.

14. The method of claim 1 wherein the patterned substrate further comprises an exposed silicon region and the selectivity of the etching operation (exposed silicon-and-carbon-containing region: exposed silicon region) is greater than or about 15:1.

15. The method of claim 1 wherein the fluorine-containing precursor comprises $NF_3$.

16. The method of claim 1 wherein the fluorine-containing precursor comprises a precursor selected from the group consisting of hydrogen fluoride, atomic fluorine, diatomic fluorine, nitrogen trifluoride, carbon tetrafluoride and xenon difluoride.

17. The method of claim 1 wherein the fluorine-containing precursor and the plasma effluents are essentially devoid of hydrogen.

18. The method of claim 1 wherein there is essentially no concentration of ionized species and free electrons within the substrate processing region.

19. The method of claim 1 wherein the minimum ID of the through-holes in the showerhead is between about 0.2 mm and about 5 mm.

* * * * *